(12) United States Patent
Hall

(10) Patent No.: US 6,987,058 B2
(45) Date of Patent: Jan. 17, 2006

(54) METHODS FOR UNDERFILLING AND ENCAPSULATING SEMICONDUCTOR DEVICE ASSEMBLIES WITH A SINGLE DIELECTRIC MATERIAL

(75) Inventor: Frank L. Hall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 10/391,109

(22) Filed: Mar. 18, 2003

(65) Prior Publication Data

US 2004/0184226 A1 Sep. 23, 2004

(51) Int. Cl.
*H01L 21/44* (2006.01)

(52) U.S. Cl. ............. 438/617; 257/784; 257/778; 438/127; 174/52.4

(58) Field of Classification Search ............. 361/760, 361/808, 767, 777, 683, 748, 721; 29/846–848; 257/784, 778, 773, 684; 174/52.4, 260, 261, 174/251; 438/617, 127
See application file for complete search history.

(56) References Cited

U.S. PATENT DOCUMENTS

| | | | | |
|---|---|---|---|---|
| 4,796,157 A | * | 1/1989 | Ostrem | ............. 361/717 |
| 5,120,678 A | | 6/1992 | Moore et al. | |
| 5,203,076 A | | 4/1993 | Banerji et al. | |
| 5,218,234 A | | 6/1993 | Thompson et al. | |
| 5,296,074 A | * | 3/1994 | Graham et al. | ............. 156/309.9 |
| 5,710,071 A | | 1/1998 | Beddingfield et al. | |
| 5,739,585 A | | 4/1998 | Akram et al. | |
| 5,973,404 A | * | 10/1999 | Akram et al. | ............. 257/778 |
| 6,013,946 A | * | 1/2000 | Lee et al. | ............. 257/684 |
| 6,214,635 B1 | | 4/2001 | Akram et al. | |
| 6,221,689 B1 | | 4/2001 | Maa et al. | |
| 6,225,144 B1 | | 5/2001 | How et al. | |
| 6,291,264 B1 | | 9/2001 | Tang et al. | |
| 6,297,560 B1 | | 10/2001 | Capote et al. | |
| 6,385,049 B1 | * | 5/2002 | Chia-Yu et al. | ............. 361/721 |
| 6,400,036 B1 | | 6/2002 | Tang et al. | |
| 6,455,933 B1 | | 9/2002 | Akram et al. | |
| 6,492,204 B1 | * | 12/2002 | Jacobs | ............. 438/127 |
| 2001/0000927 A1 | | 5/2001 | Rodenbeck et al. | |
| 2002/0001937 A1 | | 1/2002 | Kikuchi et al. | |
| 2002/0028533 A1 | | 3/2002 | Tang et al. | |
| 2002/0033540 A1 | | 3/2002 | Akram et al. | |
| 2002/0060368 A1 | | 5/2002 | Jiang | |

* cited by examiner

*Primary Examiner*—Kamand Cuneo
*Assistant Examiner*—Hung S. Bui
(74) *Attorney, Agent, or Firm*—TraskBritt

(57) ABSTRACT

A semiconductor assembly includes at least one semiconductor die and a carrier substrate adhered and maintained in spaced-apart relation to one another by at least one adhesive element. Through an opening in the carrier substrate, the assembly has intermediate conductive elements extending between bond pads of the semiconductor die and contact pads of the carrier substrate. The carrier substrate has a dam formed around the contact pads. A dielectric filler material disposed between the semiconductor die and the carrier substrate at least partially fills the opening, is laterally contained by the dam, and encapsulates the intermediate conductive elements, as well as at least filling the space between the semiconductor die and carrier substrate and forming a fillet about the periphery of the semiconductor die.

19 Claims, 4 Drawing Sheets

METHODS FOR UNDERFILLING AND ENCAPSULATING SEMICONDUCTOR DEVICE ASSEMBLIES WITH A SINGLE DIELECTRIC MATERIAL

BACKGROUND OF THE INVENTION

1. Field of the Invention

The present invention relates generally to methods and apparatuses for packaging semiconductor dice to a carrier substrate. More specifically, the present invention relates to semiconductor dice bonded to a carrier substrate and encapsulated using the same dielectric material as the underfill and encapsulant, as well as to methods of manufacturing such assemblies.

2. State of the Art

Electronic devices—a combination of a plurality of electronic components, such as resistors, capacitors, inductors, transistors, and the like, fabricated as integrated circuits and mechanically and electrically interconnected by conductive paths and mounted to a carrier substrate, such as a printed circuit board (PCB)—are essential components of modern life found in equipments or technologies ranging from every day items, such as televisions, microwaves, and simple digital clocks, to all sorts of sophisticated medical equipment, computers, airplanes, and satellites. As these different technologies become more and more sophisticated and advanced, the manufacturers of electronic devices in the form of integrated circuits fabricated on semiconductor dice are faced with the conflicting requirement of packing significantly higher numbers of electronic components on substrates that continue to shrink in size because of the ever-increasing desire for component and equipment miniaturization. Therefore, as the size of semiconductor dice decrease with each generation, a greater precision is required in placing and connecting the different electronic components to the substrates while, at the same time, finding ways to reduce the time required to manufacture these components continues to be a priority.

Initially, electronic components were mounted to printed circuit boards by feeding component leads through pre-drilled holes and soldering the leads to the contact pads on the circuit board. Such a mounting approach made it simple to remove and repair defective components by melting the previously deposited solder, removing the inoperative element, and soldering a new one in its place. As the size of integrated circuits decreased and the number of components in a board increased, surface mounting technologies were developed to allow the electronic elements to be mounted directly to the surface of the printed circuit board, thus reducing the size of contact pads and their proximity in the board. The flip-chip technology is a conventional integrated circuit packaging approach that allows the overall package to be made very compact. Other examples of conventional packaging technology include Chip-On-Board ("COB") or Board-On-Chip ("BOC") technology, wherein a semiconductor die is attached directly to a carrier substrate, such as an interposer or printed circuit board. Electrical and mechanical interconnection used in COB or BOC technology may include flip-chip attachment techniques, wire bonding techniques, or tape automated bonding ("TAB") techniques.

A flip-chip package configuration includes at least one semiconductor chip or die mounted in an active surface-down manner over a substrate carrier or another semiconductor chip electrically and mechanically coupled to the same by means of conductive bumps. Several materials are typically used to form the conductive bumps, such as conductive or conductor-filled polymers, solder, etc. If the conductive bumps are solder bumps, the solder bumps are reflowed to form solder joints that are secured to bond pads on the flip-chip mounting, or active, surface. However, due to the presence of the bumps between the flip-chip and the substrate carrier or other semiconductor chip, a gap exists between the substrate and the active surface of the flip-chip. Also, a typical problem of flip-chip packages is the fact that the materials used to make the electronic components, the solder, and the circuit board have different coefficients of thermal expansion. During operation, increases in temperature will typically cause a circuit board to expand more than the component or chip mounted thereto, while cooling produces the opposite result. The net effect of such temperature cycling is that the solder joints are strained, resulting in early fracture failures.

A solution to this problem of strained solder joints is the use of a dielectric underfill or barrier material between the carrier substrate and the electronic component. Initially, a flux, generally a no-clean, low-residue flux, is placed on the semiconductor chip or carrier substrate to facilitate joining of the integrated circuit to the carrier substrate. Then the underfill or barrier material is introduced between the semiconductor chip and the carrier substrate. An underfill can be thought of as an adhesive that mechanically couples the low-expansion chip to the high-expansion substrate, including any solder joints or other conductive structures therebetween. Conventionally, the use of underfill materials was typically limited to use with assemblies that included flip-chip type connections or other devices with ball grid array (BGA) connection patterns (e.g., BGA packages). Flux residues that remain in the gap between the semiconductor chip and carrier substrate reduce the adhesive and cohesive strengths of the underfill-encapsulating adhesive, affecting the reliability of the assembly.

Furthermore, in order to protect and seal an assembly that includes underfill material, a different, curable, encapsulating material is typically deposited over the package after the underfill is dispensed and cured. Encapsulating materials include epoxy, silicone, polyimide, and room temperature vulcanizing ("RTV") materials. The reflowing of the solder bumps and underfilling and curing the underfill material and encapsulant is a multistep process that results in reduced productivity and yield, making the assembly of encapsulated flip-chip printed circuit boards a time-consuming, labor-intensive, and expensive process with a number of uncertainties. As chip assembly becomes better understood and reliable packaging methods become available in the marketplace, mounting methods that increase productivity are highly desirable. Underfill and encapsulation processes are clearly bottlenecks to increased productivity in the manufacturing of flip-chip electronic devices.

Several problems exist with the use of underfill from a manufacturing perspective. In methods that rely on capillary effects to fill the gap between the semiconductor die and the substrate, the challenge is to avoid the creation of bubbles, air pockets, or voids in the underfill material. If voiding occurs, any solder bumps that exist in the voided area will be subjected to thermal fatigue as if the underfill material were not present. Preventing voids in the underfill material is governed by the material characteristics, such as viscosity, rheology, and filler content, and the method used for application. U.S. Pat. No. 5,218,234 to Thompson et al. discloses a semiconductor assembly whereby an epoxy underfill is accomplished by applying the epoxy around the perimeter of the flip-chip mounted on the substrate and allowing the epoxy to flow underneath the chip. Alternatively, the underfill can be accomplished by backfilling the gap between the flip-chip and the substrate through a hole in the substrate beneath the chip. Such a method increases the manufacturing time because of the need to wait for the epoxy to cure and also increases cost because of the specialized substrate configuration needed. In addition, with larger-size semiconductor chips, the limiting effect of capillary action becomes more critical and makes the encapsulation procedure more time consuming, more susceptible to void formation, and more susceptible to the separation of the polymer from the fillers during application.

Barnerji et al. (U.S. Pat. No. 5,203,076) discloses the use of a vacuum chamber to apply underfill material to the gap between the semiconductor chip and the carrier substrate. A bead of underfill polymeric material is dispensed on the substrate around the periphery of the chip and a vacuum is applied to force the underfill into the gap. Such an approach also adds to the manufacturing cost because of the additional equipment, in particular the vacuum chamber, needed to implement it.

Most underfill application methods use a heated dispensing zone. Subsequently, the assembly is first conveyed to a cooling zone to allow the underfill to at least partially solidify, the assembly being later heated again to complete the curing process. However, in order to increase production rates, the assembly may be prematurely removed from the heated dispensing zone and the underfill may not have been completely drawn into the gap between the semiconductor chip and the carrier substrate. It is understood by those of ordinary skill in the art that properly executing the foregoing process increases the manufacturing time while providing inadequate underfill dispense time and may reduce yield.

An ongoing problem associated with the use of wire bonding in packaging occurs during a transfer molding encapsulation process of the semiconductor die in what is known as "wire sweep." Wire sweep results when a wave front of dielectric (commonly a silicon-filled polymer) encapsulation material moving through a mold cavity across the semiconductor die and carrier substrate assembly forces bond wires to contact adjacent bond wires and become fixedly molded in such a contacted position after the encapsulation material sets. When wire sweep occurs, the contacting bond wire interconnections of a semiconductor die to a carrier substrate short circuit, resulting in a nonfunctional semiconductor die assembly. Wire sweep may also result in bond wire breakage or disconnection from a bond pad or terminal.

Yet another problem with conventional techniques is that of bleed, or "flash," of molding compound introduced into a mold cavity to form a dielectric encapsulant over the die and carrier substrate, which problem particularly manifests itself in the case of BOC-type assemblies wherein bond pads of a semiconductor die accessed through an opening in a carrier substrate are wire bonded prior to encapsulation. Under certain conditions, such as where the die fails to overlap the opening sufficiently, pressure of the molding compound in conjunction with the configuration of the assembly causes the molding compound to bleed, or "flash," out of the mold cavity.

Accordingly, a method and apparatus to dispense a dielectric substance that would act as underfill as well as encapsulation material in the packaging of semiconductor dice would be advantageous, particularly if such method and apparatus would eliminate the problems associated with the creation of bubbles, air pockets, or voids, reduce the manufacturing time and increase yield by reducing the number of steps to complete the manufacturing process, and substantially eliminate the problem of wire sweep and molding compound bleed.

BRIEF SUMMARY OF THE INVENTION

The present invention relates to methods and apparatus for mutually securing and simultaneously encapsulating and introducing encapsulant material between a semiconductor die and a carrier substrate to substantially reduce or even prevent air pockets, bubbles, or voids and trapping of moisture between the semiconductor die and carrier substrate. Further, the present invention will significantly reduce the manufacturing time of semiconductor die and carrier substrate assemblies by eliminating dispensing and curing steps of different dielectric materials by using the same substance as underfill and encapsulant applied to the assembly in a single step. The present invention also relates to methods and apparatus for substantially preventing "wire sweep" in wire bonding packaging techniques.

The semiconductor die has an active surface with at least one bond pad exposed thereon and a backside opposite the active surface while the carrier substrate includes a first surface with conductive contact pads exposed thereon, an opposite second surface, and an opening between the first and second surfaces. The carrier substrate also includes a flash dam formed around the contact pads on the first surface thereof to assist in the flow of underfill/encapsulation material. The semiconductor die is attached to the carrier substrate and wire bonds or other intermediate conductive elements are formed between the conductive pads or terminals on the surface of the carrier substrate and the bond pads on the active surface of the semiconductor die through the slot, or opening, formed through the carrier substrate. Such attachment is facilitated by a plurality of adhesive elements of relatively small surface area, in comparison to the "footprint" of the semiconductor die over the carrier substrate. The adhesive elements provide an initial bond between the semiconductor die and the carrier substrate while providing a gap, or standoff, therebetween to space the semiconductor die and the carrier substrate apart from one another. A dielectric encapsulant material is disposed around the perimeter of the semiconductor die and into the gap, or standoff, to further bond the semiconductor die to the carrier substrate. The encapsulant material, due in part to its surface tension, is contained by the flash dam and may be substantially self-leveled therewith. Excess encapsulant material at the first surface of the carrier substrate encapsulates the peripheral edges of the semiconductor die by forming a fillet thereat.

In another aspect of the present invention, a method to connect a semiconductor die to an electronic circuit is disclosed, comprising: providing at least one semiconductor die having an active surface with at least one bond pad exposed thereon and a back surface; providing a carrier substrate having a first surface with conductive pads exposed thereon, an opposite second surface, and an opening between the first and second surfaces; forming a dam on the first surface of the carrier substrate around the conductive pads and the opening; attaching the second surface of the carrier substrate to the active surface of the semiconductor die and providing a gap, or standoff, therebetween using a plurality of spaced adhesive elements; forming wire bonds or other intermediate conductive elements between the bond pads and the conductive pads through the opening; placing the dam on the first surface of the attached carrier substrate and semiconductor die facing down into a recess of a tool; and introducing an encapsulant material around the perimeter of the semiconductor die into the gap, or standoff, to bond the semiconductor die to the carrier substrate. The encapsulant material, due in part to its surface tension, is contained by the dam and may substantially self-level therewith. Excess encapsulant material at the first surface of the carrier substrate encapsulates the peripheral edges of the semiconductor die by forming a fillet thereat.

In another aspect of the present invention, the semiconductor die is mounted to a circuit board in an electronic system, such as a computer system. In the electronic system, the circuit board is electrically connected to a processor device that electrically communicates with an input device and an output device.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, wherein:

DETAILED DESCRIPTION OF THE INVENTION

Figure 1:
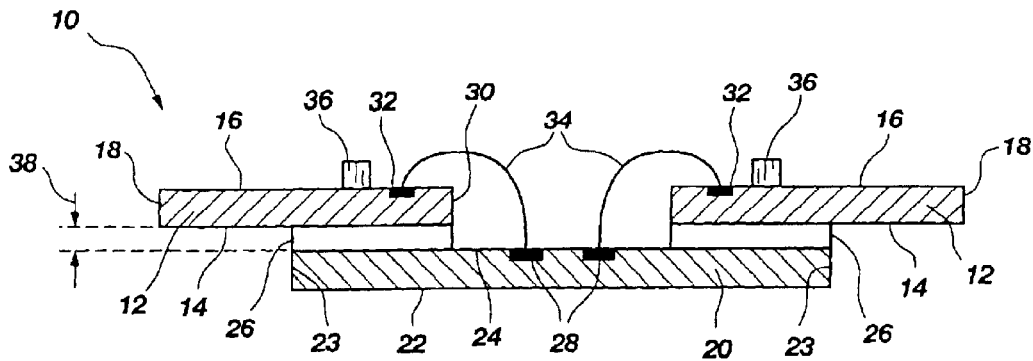
FIG. 1 illustrates a simplified cross-sectional view of a semiconductor assembly, depicting a semiconductor die attached to a carrier substrate with an adhesive element providing a gap therebetween.

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures are designated by the same or similar reference numerals.

FIGS. 1 through 5 illustrate a process that may be used for packaging a semiconductor assembly 10 according to the present invention. As illustrated in FIG. 1, a carrier substrate 12, having bottom and top surfaces 14 and 16, respectively, and peripheral edges 18 has a semiconductor die, shown in the form of semiconductor die 20, positioned thereon and secured thereto with a plurality of discrete adhesive elements 26. The adhesive elements 26 may comprise adhesive-coated strips (i.e., elongated elements) or point elements that include, for example, pressure-sensitive adhesive, thermoset resin, and/or epoxy, etc., or dispensed quantities (e.g., in the form of either elongate elements or point elements) of suitable adhesive material as known in the art. The carrier substrate 12 may also include an opening therein, for example, in the form of an opening 30 extending from the top surface 16 to the bottom surface 14. The carrier substrate 12 also has a plurality of conductive contact pads 32 on at least one of its surfaces 14 and 16, as well as a flash dam 36 that protrudes from the top surface 16 and substantially surrounds the conductive contact pads 32 thereon. The flash dam 36 may be made of any suitable material known in the art such as patterned photoresist or other polymer, a dispensed bead of silicone or epoxy, a preformed frame of dielectric material, or the like. The carrier substrate 12 may be any suitable type of substrate known in the art, such as an interposer or printed circuit board, and may also be made of any type of substrate material known in the art, such as bismaleimide triazine (BT) resin, ceramics, or FR-4 or FR-5 materials.

The semiconductor die 20 shown in FIGS. 1 through 5 includes an active surface 24, a back surface 22, contact or bond pads 28 formed on the active surface 24, and side surfaces 23. The contact or bond pads 28 may, as illustrated, be centrally located and arranged in one or more rows on the active surface 24 of the semiconductor die 20 and communicate with integrated circuitry (not shown) formed on the active surface 24 of the semiconductor die 20. The semiconductor die 20 is preferably formed on a silicon substrate, but may be formed on a substrate of germanium, gallium arsenide, indium phosphide, or any other known semiconductive material with electrical conductivity and resistivity that lie between those of a conductor and an insulator. As used herein, the term "semiconductor die" includes singulated dice, groups of dice (partial wafers), wafers, and bulk substrates of semiconductive materials other than conventional wafers and including, without limitation, silicon on glass (SOG), silicon on insulator (SOI), and silicon on sapphire (SOS) substrates.

The active surface 24 of the semiconductor die 20 is secured face-up (as depicted in FIG. 1) to the bottom surface 14 of the carrier substrate 12 so that the contact or bond pads 28 are exposed through the opening 30 in the carrier substrate 12. The semiconductor die 20 is attached to the carrier substrate 12 with one or more discrete adhesive elements 26, such as the two depicted adhesive strips. The discrete adhesive elements 26 are configured so as to provide a standoff or gap 38 between the semiconductor die 20 and carrier substrate 12. Further, the discrete adhesive elements 26 disposed between the semiconductor die 20 and the carrier substrate 12 are sized and configured to temporarily secure the semiconductor die 20 and carrier substrate 12 together in proper relative position and alignment prior to the introduction of another, primary encapsulating, or bonding, agent between the two components. The adhesive elements 26 may be any known adhesive structures, such as adhesive-coated dielectric tape segments such as Kapton® or other polymer segments, reduced tape decals, or epoxy drops applied to one of the components and partially cured before application of the other thereto, preformed adhesive segments, or the like. The adhesive elements 26 may alternatively comprise metallic or other conductive bonding elements, such as a bond facilitated with solder or solder balls or the like so as to raise the carrier substrate 12 from the surface of the semiconductor die 20 to provide the standoff or gap 38 therebetween. Of course, in that instance, a suitable dielectric material or structure may be interposed between active surface 24 and the metallic bonding elements unless the metallic or other conductive bonding elements were used to ground or electrically bias the semiconductor die 20. With such arrangements, wire bonds 34, or other intermediate conductive elements, may be formed to extend through the opening 30 and contact between the contact or bond pads 28 on the active surface 24 of the semiconductor die 20 and conductive contact pads 32 on the top surface 16 of the carrier substrate 12.

Figure 2:
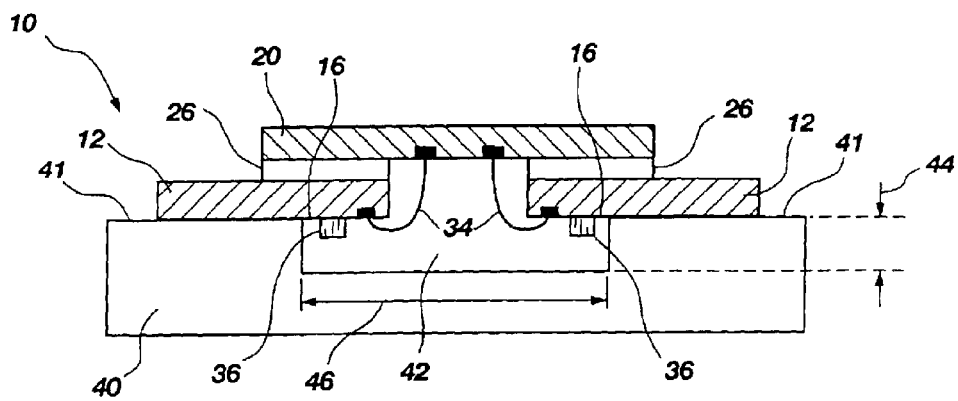
FIG. 2 illustrates a simplified cross-sectional view of a semiconductor assembly, depicting the semiconductor assembly of FIG. 1 flipped over and positioned into a recess of a tool.

In preparation for dispensing filler material, the semiconductor die 20/carrier substrate 12/assembly 10 of FIG. 1 is flipped, or inverted, and positioned into the recess 42 of a tool 40, such as a mold or other encapsulation tool, as illustrated in FIG. 2. The inverted top surface 16 of the substrate carrier 12 rests against the top surface 41 of the recessed tool 40 and the size of recess 42 in terms of the dimensions 46 and 44 thereof are such that the flash dam 36 fits inside.

Figure 3:
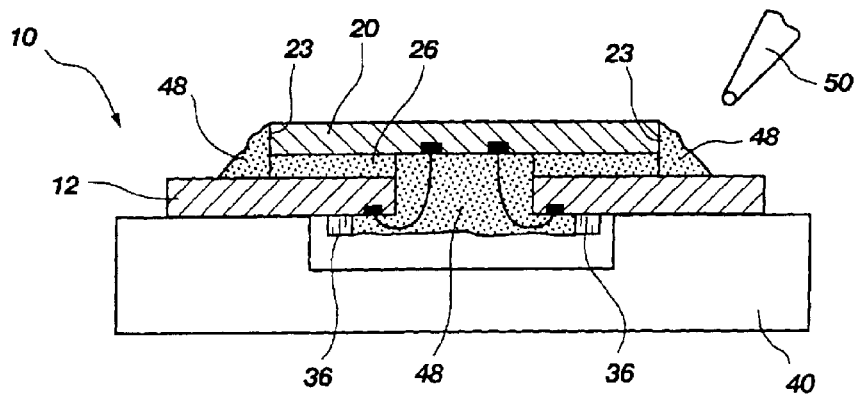
FIG. 3 illustrates a dispensing tool to fill the gap between the semiconductor die and carrier substrate by depositing filler material around the perimeter of the semiconductor die, wherein the filler material is contained by a flash dam and encapsulates the side surfaces of the semiconductor die.

Turning to FIG. 3, the semiconductor assembly 10 is then ready to receive a dielectric filler, or "encapsulant," material 48 from, for example, an encapsulant dispenser head or underfill needle 50. In particular, dielectric filler material 48 may be dispensed from the dispenser head or underfill needle 50 around the perimeter and along the side surfaces 23 of the semiconductor die 20, filling the gap 38 between the semiconductor die 20 and carrier substrate 12 and the opening 30. The dielectric filler material 48 may flow into the standoff or gap 38 and the opening 30 solely by the effect of gravity and substantially level itself, due to both gravity and surface tension of the dielectric filler material 48, with the flash dam 36. Alternatively, or in addition, the dielectric filler material 48 may flow into and substantially fill the standoff or gap 38 and opening 30 by capillary action or under positive or high pressure, such as methods utilizing pressurization to the outer periphery of gap 38 and side surfaces 23 of the semiconductor die 20 or through a cut or other opening in the recess 42 of the tool 40. Negative pressure may also be applied to recess 42 to draw encapsulant material into the gap 38. Of course, if pressure is used to effect the flow of dielectric filler material 48, it is employed in such a way as to move the dielectric filler material 48 in a direction that will minimize or eliminate the occurrence of wire sweep by introducing the encapsulant material substantially parallel to the direction of the wire bonds.

The curing or hardening of dielectric filler material 48 surrounding the wire bonds 34 provides a stabilizing effect to the wire bonds 34 to help prevent movement thereof and wire sweep between adjacent wire bonds 34 during any further encapsulation processes. According to the present invention, the dielectric filler material 48 coats and encapsulates not only at least a portion of the wire bonds 34 proximate the contact or bond pads 28 on the active surface 24 of the semiconductor die 20, filling opening 30 and encapsulating the wire bonds 34 that extend to the contact or bond pads 28, but also at least the side surfaces 23 of the semiconductor die 20, as illustrated in FIG. 3. By introducing the dielectric filler material 48 into the standoff or gap 38 and over the side surfaces 23 of the semiconductor die 20, it will provide a permanent, secure, and inflexible bond between the semiconductor die 20 and carrier substrate 12 as well as at least partially encapsulate the semiconductor die 20 using a single-step process. It will be understood by those of ordinary skill in the applicable arts that such an approach will significantly reduce the time required to manufacture these electronic assemblies by eliminating at least the steps of curing the underfill material and dispensing encapsulating material different than the underfill substance. Also, utilizing dielectric filler material 48 to bond the semiconductor die 20 to the carrier substrate 12 is much more cost effective, in comparison to utilizing an adhesive element or elements as a primary bonding agent. It should be noted that the particle size of the dielectric filler material is generally substantially smaller than the particle size of filled polymer encapsulants used, for example, in transfer molding, enhancing flow of the dielectric filler material past and surrounding wire bonds 34. Also, in order to facilitate the flow of the dielectric filler material 48, the carrier substrate 12 and/or the dispenser head or underfill needle 50 may be heated so as to reduce the viscosity of the dielectric filler material 48 during the underfill/encapsulation process.

Figure 4:
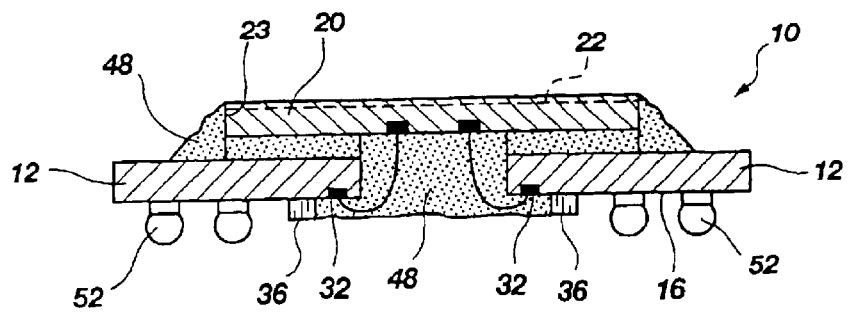
FIG. 4 illustrates a simplified cross-sectional view of a semiconductor assembly, depicting the semiconductor assembly of FIG. 3 prepared to be ball-attached and singulated.

As shown in FIG. 4, semiconductor assembly 10 may be completed in a ball grid array configuration with solder balls, conductive or conductor-filled epoxy bumps, pillars or columns or other discrete conductive elements 52 formed on the top surface 16 of carrier substrate 12 and electrically connected to conductive contact pads 32 or terminals, by conductive traces (not shown), as well known in the art. As shown in broken lines in FIG. 4, the back surface 22 of semiconductor die 20 may be nitrided, oxidized, or otherwise passivated or may have a coating of glass or polymer applied thereto prior to die singulation so that semiconductor die 20 may be completely encapsulated.

Figure 5:
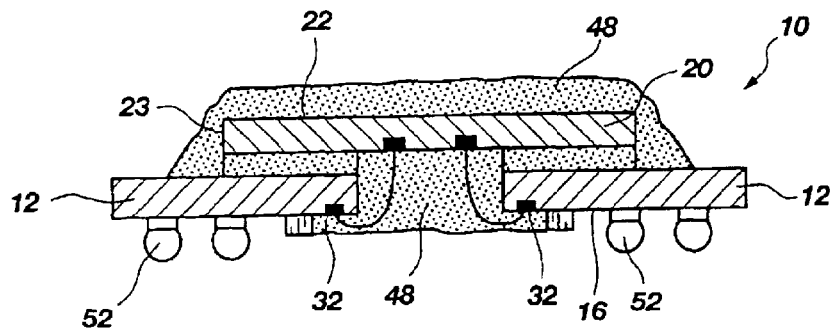
FIG. 5 illustrates another embodiment of the present invention, wherein the filler material further also encapsulates the back surface of the semiconductor die.

A variant embodiment of the present invention is shown in FIG. 5, wherein the dielectric filler material 48 is also dispensed on top of the back surface 22 of the semiconductor die 20 in order to completely encapsulate the device. Afterwards, the semiconductor assembly 10 may be completed in a ball grid array configuration with solder balls, conductive or conductor-filled epoxy bumps, pillars or columns or other discrete conductive elements 52 formed on the top surface 16 of carrier substrate 12 and electrically connected to conductive contact pads 32 or terminals by conductive traces (not shown), as well known in the art.

FIGS. 6 through 9 show several top views from the die sides of assemblies according to the present invention, illustrating the carrier substrate 12 with various exemplary, suitable adhesive element arrangements, among a wide variety of adhesive element arrangements, that may be utilized for attaching the semiconductor die 20 thereto. The adhesive element 26 (FIG. 1) thickness and its arrangement may be selected to provide an initial, temporary but adequately secure bond between the semiconductor die 20 and carrier substrate 12 and to provide an adequate standoff or gap 38 to receive dielectric filler material 48 (FIGS. 3–5) between semiconductor die 20 and carrier substrate 12. Thereafter, dielectric filler material 48 may be dispensed around the perimeter along the side surfaces 23 of the semiconductor die 20 and introduced through the standoff or gap 38 into opening 30, at least peripherally encapsulating the semiconductor die 20, encapsulating wire bonds 34, and providing the permanent bond between the semiconductor die 20 and carrier substrate 12. It is understood also that the use of an encapsulation material different than an underfill material as the dielectric filler material is also in the scope of the invention taught and disclosed herein.

Figure 6:
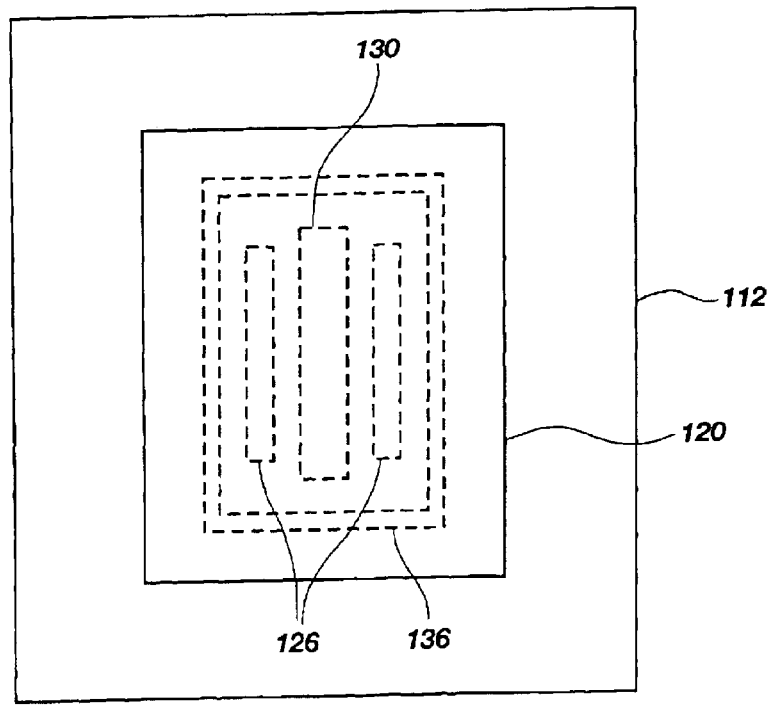
FIG. 6 is a top view of the semiconductor assembly of FIG. 1, depicting an adhesive element arrangement, according to an exemplary embodiment of the present invention.

FIG. 6 illustrates a semiconductor die 120 attached to a carrier substrate 112, wherein the locations of flash dam 136, opening 130, and two adhesive elements 126 are shown in broken lines. The adhesive elements 126 of this embodiment comprise a plurality of discrete elongated pads arranged laterally adjacent to the opening 130 and arranged to run longitudinally parallel therewith. Each elongated pad may extend substantially the length of a die attach site on the carrier substrate 112. With this configuration, dielectric encapsulant material 48 (not shown) may travel to opening 130 at the ends thereof. In the alternative, the adhesive elements 126 may comprise multiple pads, a plurality of which extends along the length of the die attach site, or any other suitable placement may be used.

Figure 7:
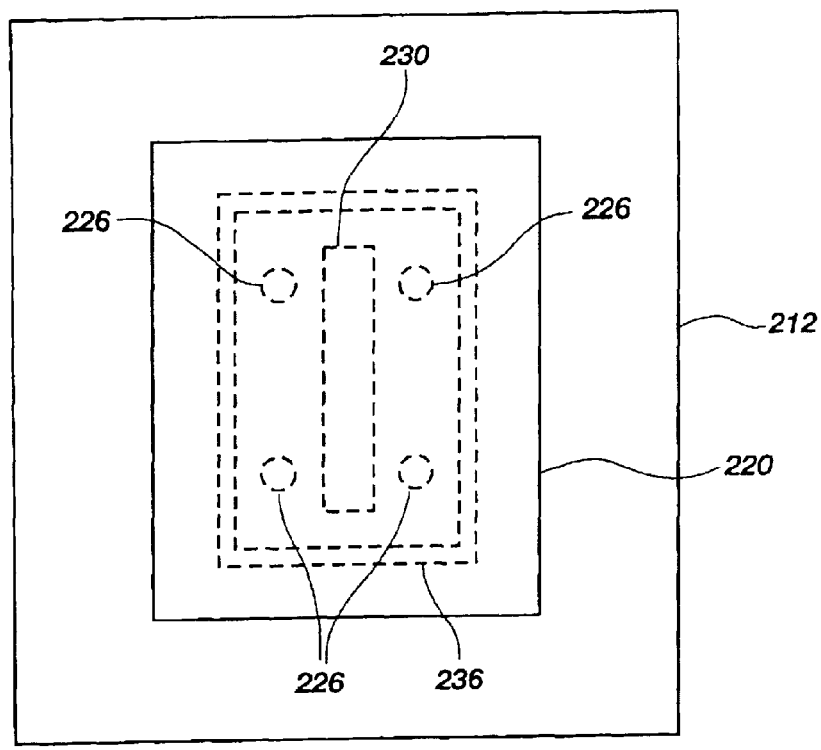
FIG. 7 is a top view of the semiconductor assembly of FIG. 1, depicting an adhesive element arrangement, according to a first variant of the first embodiment of the present invention.

FIG. 7 illustrates a semiconductor die 220 attached to a carrier substrate 212, wherein the locations of flash dam 236, opening 230, and four adhesive elements 226 configured as dots are shown surrounding the opening 230. In FIG. 7, the adhesive elements 226 are shown next to the opening 230, but they may alternatively be positioned outside the location marked by the top view outline of the flash dam 236. With this configuration, dielectric encapsulant material 48 (not shown) may flow freely from the periphery of semiconductor die 220 to opening 230.

Figure 8:
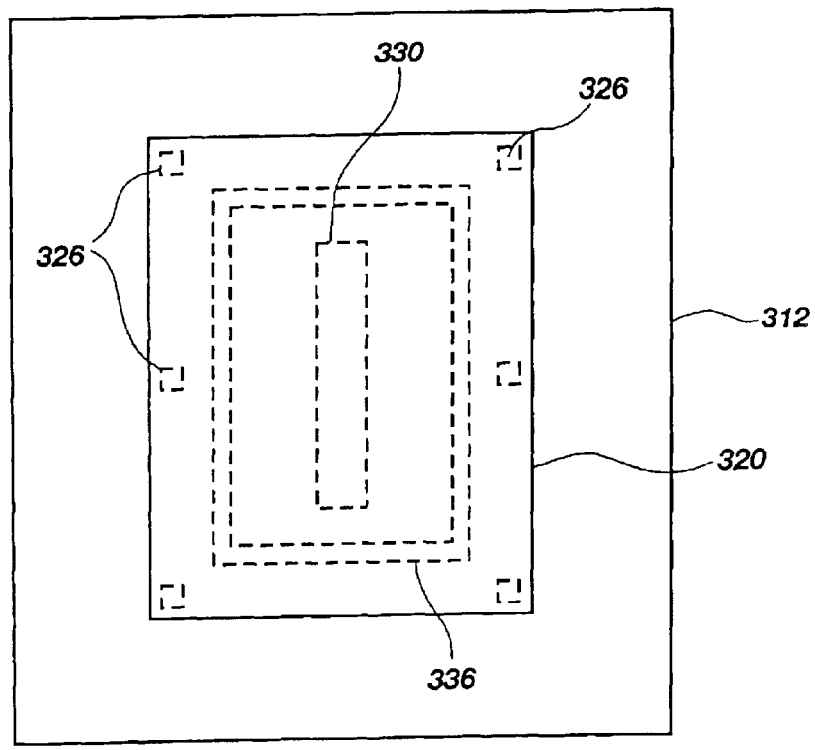
FIG. 8 is a top view of the semiconductor assembly of FIG. 1, depicting an adhesive element arrangement, according to a second variant of the first embodiment of the present invention.

FIG. 8 shows a semiconductor die 320 attached to a carrier substrate 312, wherein the locations of flash dam 336, opening 330, and six adhesive elements 326 surrounding the opening 330 are illustrated. The adhesive elements 326 may be rectangular in shape and arranged at the periphery and corners of the die attach site. The adhesive elements 326 may be selectively positioned in a symmetrical or asymmetrical arrangement. At least three, and preferably four, adhesive elements 326 should be used for stability.

Figure 9:
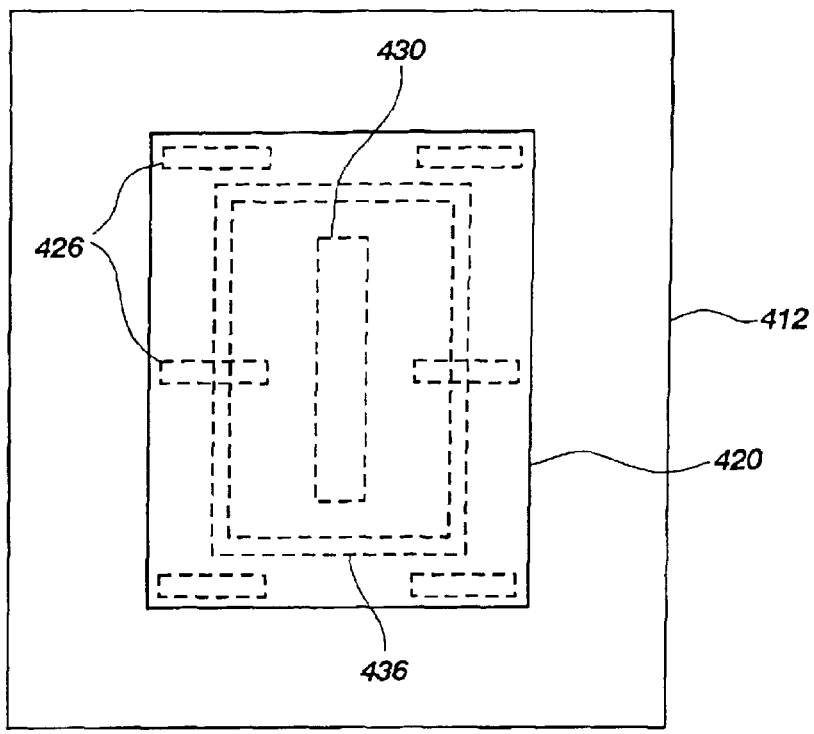
FIG. 9 is a top view of the semiconductor assembly of FIG. 1, depicting an adhesive element arrangement, according to a third variant of the first embodiment of the present invention.

FIG. 9 illustrates a semiconductor die 420 attached to a carrier substrate 412, wherein the locations of flash dam 436, opening 430, and several adhesive elements 426 having an elongated configuration are shown surrounding the opening 430. The adhesive elements 430 may be arranged laterally adjacent to the opening 430 and oriented to extend transverse thereto. As illustrated, this embodiment may include three adhesive elements 426 on each side of the opening 430. Alternatively, more or fewer pads may be utilized on each side of the opening 430.

Figure 10:
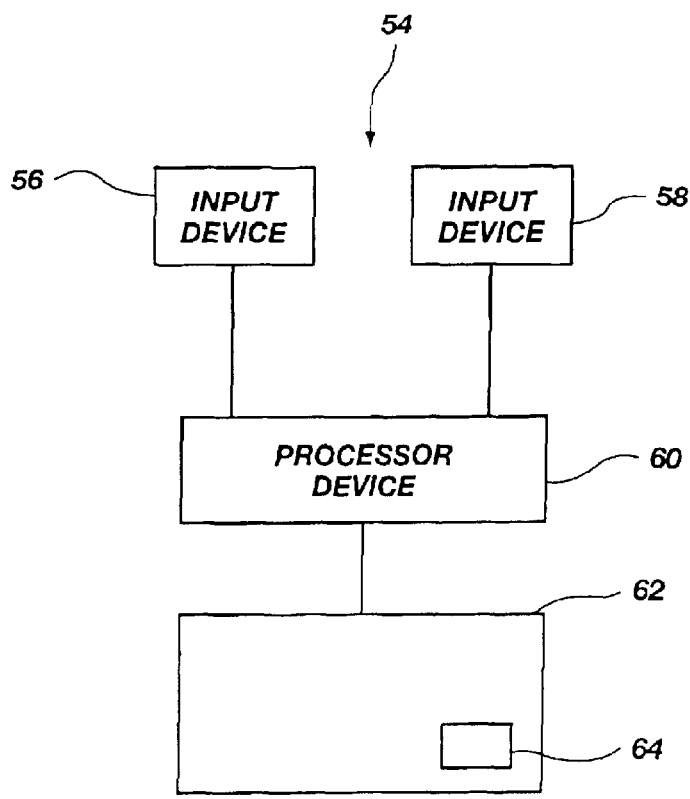
FIG. 10 illustrates a block diagram of the semiconductor assembly of the present invention interconnected to an electronic system, according to the present invention.

As illustrated in block diagram form in FIG. 10, a semiconductor assembly 64 of the present invention may be mounted to a circuit board 62 in an electronic system 54, such as a computer system. In the electronic system 54, the circuit board 62 may be connected to a processor device 60 which communicates with an input device 56 and an output device 58. The input device 56 may comprise a keyboard, mouse, joystick or any other type of electronic input device. The output device 58 may comprise a monitor, printer or storage device, such as a disk drive, or any other type of output device. The processor device 60 may be, but is not limited to, a microprocessor or a circuit card including hardware for processing instructions for the electronic system 54. Additional structure for the electronic system 54 is readily apparent to those of ordinary skill in the art.

Thus, it will be appreciated that the present invention provides a reduced-cost, structurally superior semiconductor assembly and package through reduction or elimination of the use of adhesive-coated tape. Trapped moisture problems are substantially eliminated and a robust, substantially rigid package is formed, reducing or eliminating stress defects. Further, wire sweep problems are also substantially eliminated, increasing product yield. Further, the present invention affords enhanced flexibility in assembling the semiconductor die to a carrier substrate, providing near chip-scale dimensions.

While the present invention has been disclosed in terms of certain preferred embodiments and alternatives thereof, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of packaging a semiconductor die assembly, comprising:

provinding at least one semiconductor die having an active surface with at least one bond pad exposed thereon, a back surface, and peripheral edges;

providing a carrier substrate having a first surface with at least one contact pad exposed thereon, a second surface, and an opening between first and second surfaces;

forming a dam on the first surface of the carrier substrate around the at least one contact pad and the opening;

attaching the second surface of the carrier substrate to the active surface of the at least one semiconductor die with at least one adhesive element, the at least one adhesive element spacing the canrrier substrate and the at least one semiconductor die apart from each other;

disposing at least one intermediate conductive element between the at least one bond pad and the at least one contact pad through the opening;

orienting an assembly including the carrier substrate and the at least one semiconductor die such that the dam faces downwardly in an upwardly facing recess of a tool; and introducing a dielectric filler material between the at least one semiconductor die and the carrier substrate at one or more of the peripheral edges of the at least one semiconductor die, such that the dielectric filler material enters the opening, is laterally contained by the dam, and encapsulates the at least one intermediate conductive element.

2. The method of claim 1, wherein introducing includes substantially leveling an exposed surface of the dielectric filler material within the dam.

3. The method of claim 1, wherein introducing includes encapsulating the peripheral edges of the at least one semiconductor die.

4. The method of claim 1, further comprising encapsulating the back surface of the at least one semiconductor die.

5. The method of claim 4, wherein said encapsulating the back surface comprises encapsulating the back surface with a dielectric material different than the dielectric filler material.

6. The method of claim 4, wherein introducing the dielectric filler material and encapsulating the back surface of the at least one semiconductor die are effected substantially concurrently.

7. The method of claim 1, wherein introducing comprises permitting the dielectric filler material to flow at least into the opening under force of gravity.

8. The method of claim 1, further comprising heating at least the carrier substrate before introducing the dielectric filler material.

9. The method of claim 1, further comprising heating at least the dielectric filler material before introducing the dielectric filler material.

10. The method of claim 1, wherein attaching comprises use of a plurality of adhesive elements.

11. The method of claim 10, wherein attaching comprises arranging the plurality of adhesive elements in a substantially symmetrical arrangement.

12. The method of claim 10, further comprising arranging the plurality of adhesive elements mutually separate and discrete from each other.

13. The method of claim 12, wherein arranging further comprises positioning the plurality of adhesive elements proximate at least corner portions of the at least one semiconductor die.

14. The method of claim 12, wherein arranging further comprises positioning the plurality of adhesive elements proximate at least one of the peripheral edges of the at least one semiconductor die.

15. The method of claim 10, wherein attaching further comprises selecting the plurality of adhesive elements to include at least one of point pads and elongated pads.

16. The method of claim 15, further comprising arranging the at least one of point pads and elongated pads mutually separate and discrete from each other.

17. The method of claim 15, further comprising arranging the at least one of point pads and elongated pads laterally adjacent the opening and extending substantially parallel thereto.

18. The method of claim 15, further comprising arranging the at least one of point pads and elongated pads laterally adjacent the opening and extending substantially transverse thereto.

19. The method of claim 1, further including selecting the at least one adhesive element to comprise at least one of a decal, a tape segment, and a volume of adhesive.

* * * * *

UNITED STATES PATENT AND TRADEMARK OFFICE
CERTIFICATE OF CORRECTION

PATENT NO. : 6,987,058 B2  Page 1 of 1
APPLICATION NO. : 10/391109
DATED : January 17, 2006
INVENTOR(S) : Frank L. Hall It is certified that error appears in the above-identified patent and that said Letters Patent is hereby corrected as shown below:

| | | |
|---|---|---|
| COLUMN 5, | LINE 47, | change "filler material further" to --filler material-- |
| COLUMN 7, | LINE 37, | change "substrate carrier 12" to --carrier substrate 12-- |
| COLUMN 9, | LINE 53, | change "adhesive elements 430" to --adhesive elements 426-- |
| COLUMN 10, | LINE 34, | change "between first" to --between the first-- |
| COLUMN 10, | LINE 41, | change "canrrier" to --carrier-- |
| COLUMN 10, | LINE 64, | change "wherein said encapsulating" to --wherein encapsulating-- |

Signed and Sealed this

Fifth Day of September, 2006

JON W. DUDAS
*Director of the United States Patent and Trademark Office*